United States Patent [19]
Roberts et al.

[11] Patent Number: 5,900,339
[45] Date of Patent: * May 4, 1999

[54] METHOD OF MAKING COLOR FILTER ARRAYS BY TRANSFERRING COLORANT AND LIFT-OFF

[75] Inventors: Luther C. Roberts; Ching W. Tang, both of Rochester; Robert G. Spahn, Webster, all of N.Y.

[73] Assignee: Eastman Kodak Company, Rochester, N.Y.

[*] Notice: This patent is subject to a terminal disclaimer.

[21] Appl. No.: 08/976,219

[22] Filed: Nov. 21, 1997

Related U.S. Application Data

[63] Continuation-in-part of application No. 08/789,590, Jan. 24, 1997, Pat. No. 5,756,240.

[51] Int. Cl.⁶ .................................................. G02B 5/20
[52] U.S. Cl. ........................................ 430/7; 503/227
[58] Field of Search ............................... 430/7, 199, 200; 503/227

[56] References Cited

U.S. PATENT DOCUMENTS

| | | | |
|---|---|---|---|
| 4,081,277 | 3/1978 | Brault et al. | 430/7 |
| 4,793,692 | 12/1988 | Kamio et al. | 349/106 |
| 5,756,240 | 5/1998 | Roberts et al. | 430/7 |
| 5,776,641 | 7/1998 | Roberts et al. | 430/7 |

*Primary Examiner*—John A. McPherson
*Attorney, Agent, or Firm*—Raymond L. Owens

[57] ABSTRACT

A method of making a color filter array on a first substrate is disclosed. The method includes depositing and patterning a photoresist layer on the substrate to form openings over selected regions of the substrate; providing a colorant layer having a heat transferable colorant material on a second substrate and positioning the second substrate such that the heat transferable colorant layer is in transferable relationship with but spaced a distance from the first substrate; heating the second substrate sufficiently to cause substantially all of the heat transferable colorant material to transfer across the spaced distance to the patterned photoresist layer on the first substrate; and removing the patterned photoresist layer leaving behind the heat transferable colorant material in the position of the openings over the selected regions of the first substrate.

26 Claims, 8 Drawing Sheets

METHOD OF MAKING COLOR FILTER ARRAYS BY TRANSFERRING COLORANT AND LIFT-OFF

CROSS REFERENCE TO RELATED APPLICATIONS

This is a continuation-in-part of application Ser. No. 08/789,590 filed Jan. 24, 1997, now U.S. Pat. No. 5,756,240, entitled, "Method of Making Color Filter Arrays By Transferring Colorant Material" by L. C. Roberts et al.

The present invention is related to commonly-assigned U.S. patent application Ser. No. 08/648,772 filed May 16, 1996 now U.S. Pat. No. 5,688,551 and entitled "Method of Forming an Organic Electroluminescent Display Panel" by Littman et al; commonly-assigned U.S. patent application Ser. No. 08/788,537, filed Jan. 24, 1997, and entitled "Method of Depositing Organic Layers in Organic Light Emitting Devices" by Tang et al; commonly assigned U.S. patent application Ser. No. 08/788,532, filed Jan. 24, 1997, now U.S. Pat. No. 5,811,156 and entitled "Method of Making Color Filter Arrays by Colorant Transfer and Etch" by L. C. Roberts; commonly-assigned U.S. patent application Ser. No. 08/788,108 filed Jan. 24, 1997, now U.S. Pat. No. 5,747,199 and entitled "Method of Making Color Filter Arrays by Transferring Two or More Colorants Simultaneously" by Roberts et al; and commonly-assigned U.S. patent application Ser. No. 08/787,732, filed Jan. 24, 1997, now U.S. Pat. No. 5,776,641 and entitled "Method of Making Color Filter Arrays by Colorant Transfer Using Chemical Mechanical Polishing" by Roberts et al, the disclosures of which are incorporated herein by reference.

FIELD OF THE INVENTION

The present invention relates to methods of making color filter arrays which are suitable for display applications such as liquid crystal displays and are particularly suitable for use on image sensors.

BACKGROUND OF THE INVENTION

In making color filter arrays, separate layers of different colors must be formed. Frequently these layers are formed using dye as the colorant material which is imbibed into dye receiving layers which must be of a controlled thickness, and a precise amount of dye must be used to achieve the appropriate color. See, for example, commonly assigned U.S. Pat. No. 4,764,670 to Pace et al and U.S. Pat. No. 4,876,167 to Snow et al and U.S. Pat. No. 5,576,265 to DeBoer et al which describe such a process. An additional problem associated with this process is that the dye receiving layers swell upon the introduction of dyes, limiting the smallest dimension which can be attainable for fabrication of very small filter elements. Another problem with this process is that dyes are susceptible to fading on exposure to light. In addition, the dyes spread within the dye receiving layer, resulting in loss in edge sharpness of the filter elements.

Turning to FIG. 1, which shows a method for making coatings from evaporated organic colorants. A substrate 102 is positioned adjacent to an aperture mask 104. The aperture mask provides an aperture over a portion of the substrate. An organic colorant which is to provide the coating is placed into a source boat 100, which is heated by passing an electric current through it. Alternatively, the boat may be heated by the application of radiant heating from a suitably placed heat source. Upon being heated under reduced pressure, the colorant vaporizes and travels from the source, impinging on mask 105. The portion of colorant vapor which passes through the opening in mask 105 travels along the lines 103, and between those lines, depositing on the substrate 102 and mask 104.

There are a number of problems associated with this technique which involves depositing layers in a partial vacuum and is frequently referred to in the art as physical vapor deposition (PVD). In certain cases, it is difficult to control the thickness and uniformity of the colorant disposed over the pixels. The process of vacuum deposition of the colorant typically requires the use of an appropriate placement of sources or masks or moving substrate fixtures to produce a coating which is uniform. However, the colorant material may deposit on the mask and vacuum fixtures to such a degree that it flakes off, creating undesirable contamination and waste of the colorant, and requiring frequent clean-up. In addition, the moving fixtures may generate undesirable particulate materials which may cause contamination of the substrate.

Some other problems in making color filter arrays by the PVD process are the need to use a large source-to-substrate spacing which requires large chambers and large pumps to reach a sufficient vacuum, and the need for masks which cause low-material utilization and build-up on the mask with the concomitant contamination problems. Very specific off-axis source location relative to the substrate, which is sometimes needed for uniform coating, causes very poor material utilization. Still further, source replenishment problems exist for coating multiple substrates in one pump-down. In addition, when multiple layers are deposited, the process needs to be carefully monitored for the thickness of layers in the multiple colorant coatings in multiple cycles.

SUMMARY OF THE INVENTION

It is an object of the present invention to provide an improved method for making color filter arrays which obviates the above difficulties, provides uniform colorant over the light filtering region of a transparent substrate at low cost and high quality.

This object is achieved by a method of making a color filter array on a first substrate, comprising the steps of:
  a) depositing and patterning a photoresist layer on the first substrate to form openings over selected regions of the first substrate;
  b) providing a transferable colorant layer having a heat transferable colorant material on a second substrate and positioning the second substrate such that the heat transferable colorant layer is in transferable relationship with but spaced a distance from the first substrate;
  c) heating the second substrate sufficiently to cause substantially all of the heat transferable colorant material to transfer across the spaced distance to the patterned photoresist layer on the first substrate, and
  d) removing the patterned photoresist layer leaving behind the heat transferable colorant material in the position of the openings over the selected regions of the first substrate.

This object is also achieved by a method of making a color filter array which is similar to that given above comprising the steps of:
  a) depositing and patterning a photoresist layer on the first substrate to form openings over selected regions of the first substrate;
  b) etching through the openings in the patterned photoresist layer using it as a mask, to form a pattern of recesses in the first substrate;

c) providing a transferable colorant layer having a heat transferable colorant material on a second substrate and positioning the second substrate such that the heat transferable colorant layer is in transferable relationship with but spaced a distance from the first substrate;

d) heating the second substrate sufficiently to cause substantially all of the heat transferable colorant material to transfer across the spaced distance to the patterned photoresist layer on the first substrate; and e) removing the patterned photoresist layer, leaving behind the heat transferable colorant material in the position of the openings over the selected regions of the first substrate.

This object is also achieved by another method of making a color filter array which is similar to that given above comprising the steps of:

a) depositing and patterning a photoresist layer on the first substrate to form openings over selected regions in the substrate;

b) etching through the openings in the patterned photoresist layer, using it as a mask, to form a pattern of recesses in the first substrate;

c) depositing and patterning a second photoresist layer on the patterned photoresist layer to form openings over second selected regions of the first substrate;

d) providing a heat transferable colorant layer having a heat transferable colorant material on a second substrate and positioning the second substrate such that the heat transferable colorant layer is in transferable relationship with but spaced a distance from the first substrate;

e) heating the second substrate sufficiently to cause substantially all of the heat transferable colorant material to transfer across the spaced distance to the second patterned photoresist layer on the first substrate; and f) removing both the patterned photoresist layers, leaving behind the heat transferable colorant material in the position of the openings over the second selected regions of the first substrate.

Advantages of this technique include the effective utilization of evaporant materials with high quality uniformity over large areas. Other advantages include precise control of layer thickness and lower maintenance of deposition vacuum chambers. In addition, the present invention provides an evaporative purification of the colorant during the preparation of the transferable colorant coating, and it requires minimal monitoring for the subsequent deposition process. Still further, it offers the ability to coat at higher pressures and in smaller vacuum chambers which permit faster cycle time and the use of lower-cost vacuum equipment than for standard PVD techniques.

It will be understood that the drawings are not to scale and have been shown for clarity of illustration.

DETAILED DESCRIPTION OF THE PREFERRED EMBODIMENTS

Figure 1:
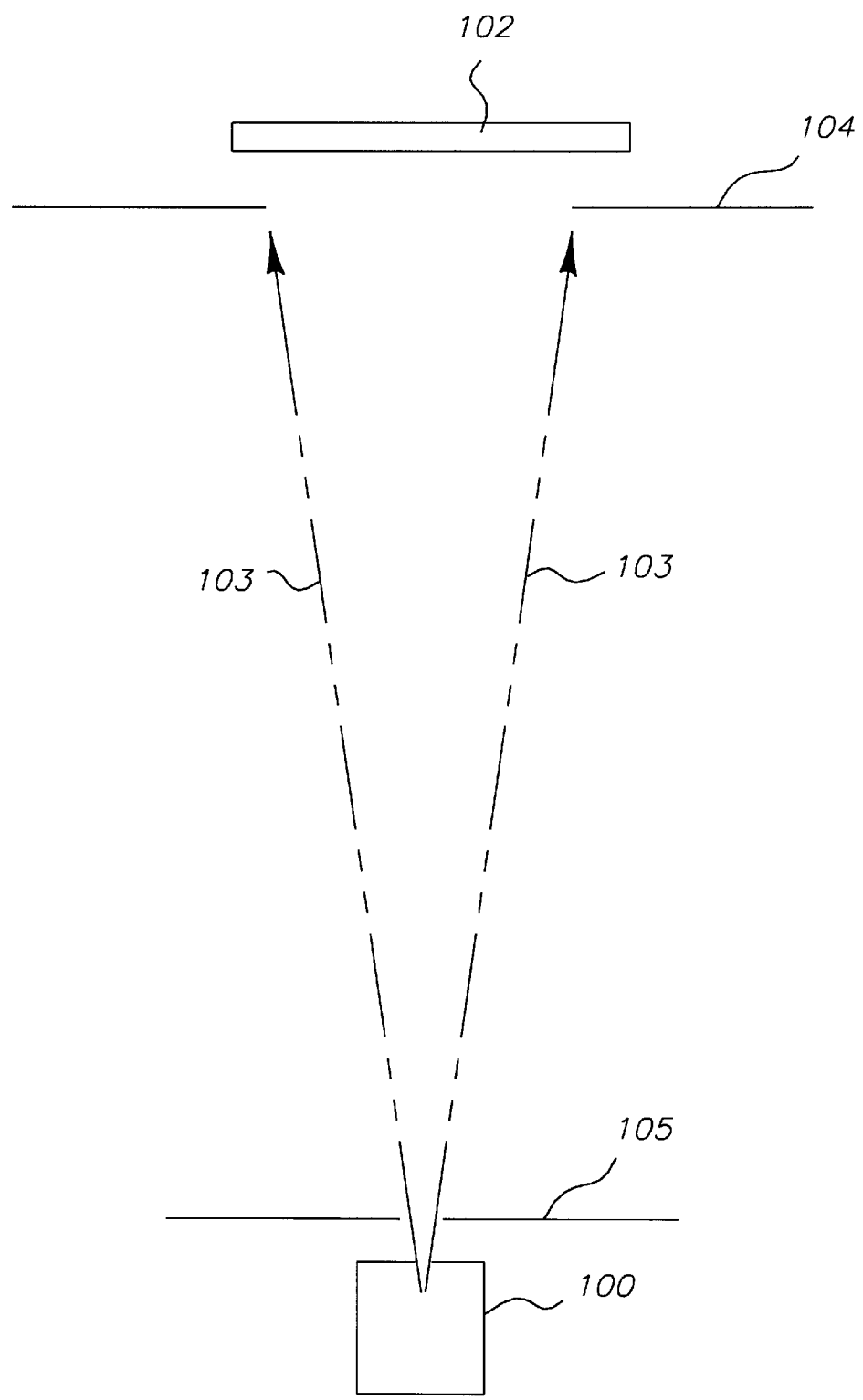
FIG. 1 shows a typical configuration for conventional physical vapor deposition (PVD)

Turning first to FIG. 1, an arrangement for conventional PVD is shown, including a heated source 100, containing the material to be deposited, the substrate 102, and masks 104 and 105 which restrict the material vapor to paths 103 and the region in between.

Figure 2:
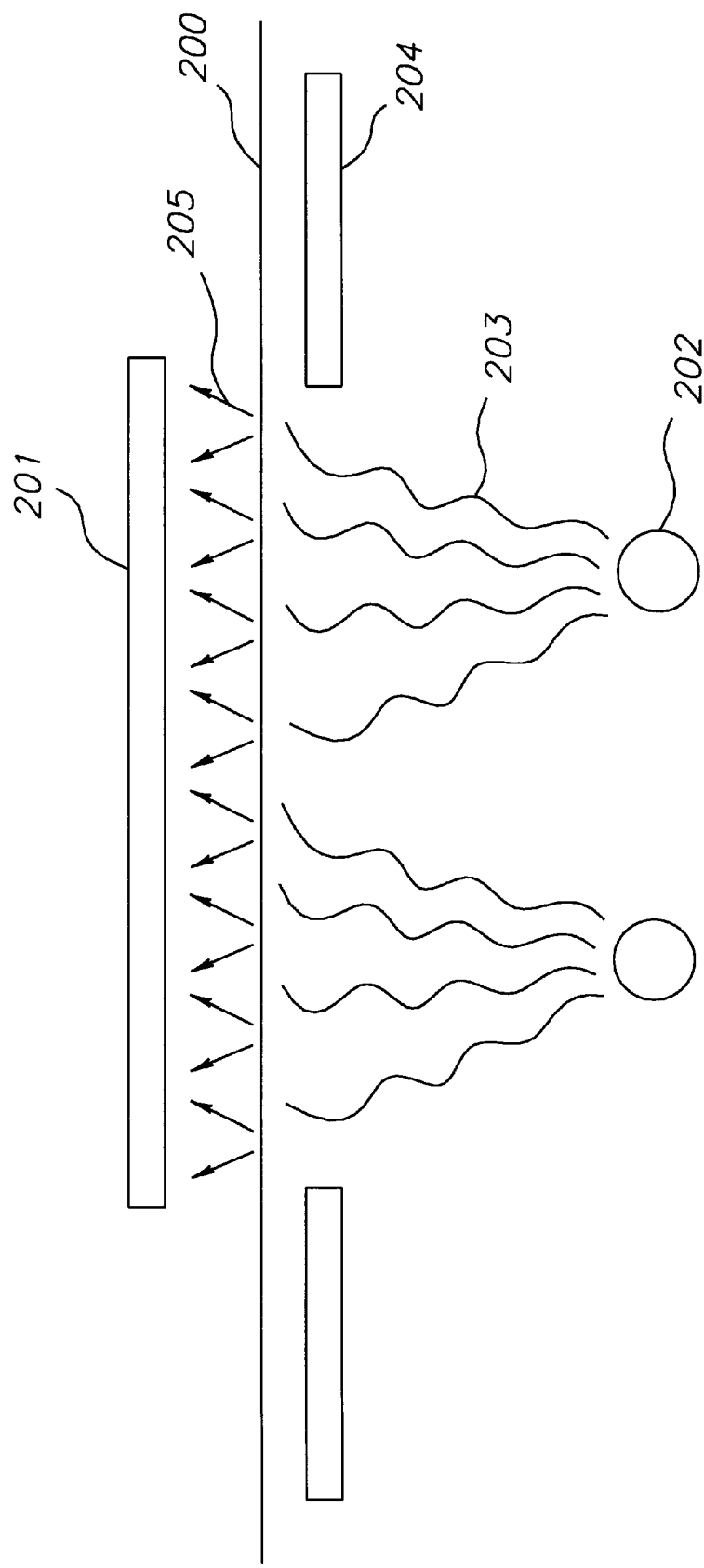
FIG. 2 shows a typical configuration for the thermal transfer of a material from an intermediate substrate to the final substrate, according to the present invention.

In FIG. 2 is shown a configuration for the transfer of a material which has been deposited as a coating on the first substrate 200, onto the second substrate 201 as indicated by the arrows 205 and which is promoted by heating with heat sources 202 as indicated by radiant heat 203 acting through an aperture 204.

Color filter arrays may be fabricated using evaporated colorants without the need for any dye receiving polymer. In order to fabricate such color filter arrays, a typical process is as follows: A photoresist layer is coated on a substrate such as glass or other transparent material. Thereafter, the photoresist is patterned to form an array of openings over selected regions which are to receive colorant material. A colorant, generally an organic dye or pigment, is then deposited over the patterned photoresist layer and, of course, deposits colorant material in the openings over the selected regions. A lift-off process is then performed and the patterned photoresist layer and the overlying colorant material on the photoresist layer are removed from the substrate. The lift-off solvent is selected so that it will dissolve or soften the photoresist layer without having any effect on the colorant material. Alternatively, an ultrasonic bath technique is used. In this technique, the substrate is immersed into a bath of a solvent and ultrasonic energy is applied to the bath to effectively remove the photoresist layer and the overlying colorant material , leaving colorant material over the selected regions. It is understood that it may be advantageous to treat the substrate surface to promote adhesion or to provide an adhesion promoting layer on the substrate.

More particularly, the lift-off process is as follows:

A photoresist layer is patterned by imagewise exposure to electromagnetic radiation of the appropriate wavelength followed by development to open up areas where subsequently deposited material is desired. The material is deposited on both the opened areas and the remaining photoresist, followed by the lift-off, in which the photoresist is dissolved or swollen in a solvent, causing it to become detached from the underlying substrate, lifting-off to leave the desired deposit in place. A description of the lift-off process and typical materials used is given in chapter 12 of Semiconductor Lithography, by W. M. Moreau, Plenum Press, N.Y., 1989.

Figure 3A:
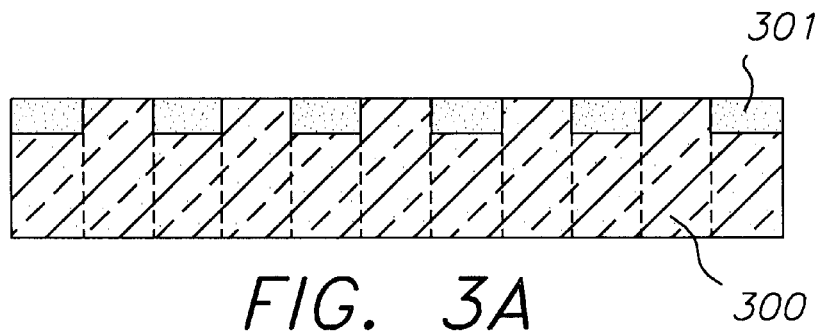
FIGS. 3a–g show various steps in a method according to the present invention for making color filter arrays.

Turning next to FIG. 3a where a transparent substrate 300 is shown, and regions 301 are indicated which are to receive colorant material and through which filtered light is to pass. As is well understood to those skilled in the art, the substrate may be a composite of different layers.

Figure 3B:
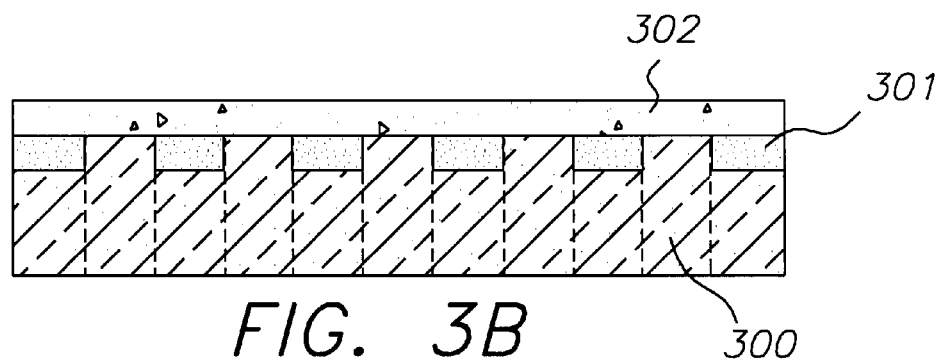

As shown in FIG. 3b, an adhesion-promoting layer 302 is formed over the surface of the substrate 300 and the regions 301. The adhesion-promoting layer 302 can be formed by a number of techniques including spin-coating of an organic polymer or of a spin-on glass, or by chemical vapor deposition. The adhesion promoting layer 302 may be patterned to form recesses in the adhesion promoting layer 302 above the pixels. Alternatively, the adhesion-promoting layer 302 may be applied after formation of the patterned photoresist layer 303.

Figure 3C:
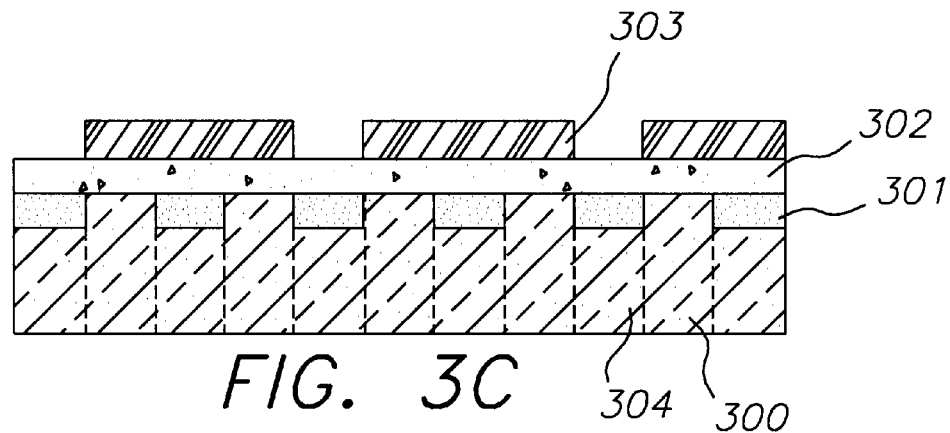

As shown in FIG. 3c, a spin-coated photoresist layer 303 is patterned to provide openings over the selected regions 304. Such patterning techniques are well known to those skilled in the art. Typically, the photoresist layer 303 can be imagewise exposed to light, illuminating particular areas of the photoresist layer 303. A development step is then used to form openings over the selected regions 304 providing the desired pattern.

Figure 3D:
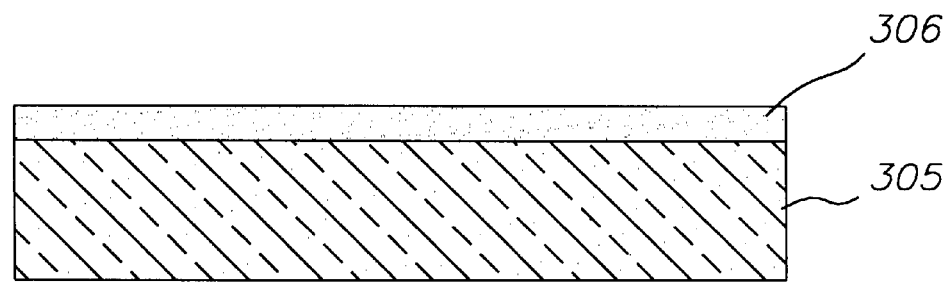

As shown in FIG. 3d, where a second substrate 305 is provided, a layer 306 having a colorant is formed on the substrate 305. (This substrate typically is stainless steel, but other substrate materials can be used which are heat resistant.) Typically, the colorant layer 306 is formed by physical vapor deposition, which provides uniform layers of controlled thickness, containing no materials with higher volatility than the colorant. The colorant layer 306 can be an organic colorant material which is transferable upon the application of energy such as heat. In a preferred embodiment of the present invention, the colorant material is vaporized by heating under reduced pressure, and condensed on a moving strip of stainless steel foil which is passed over the heated source at a constant rate.

Figure 3E:
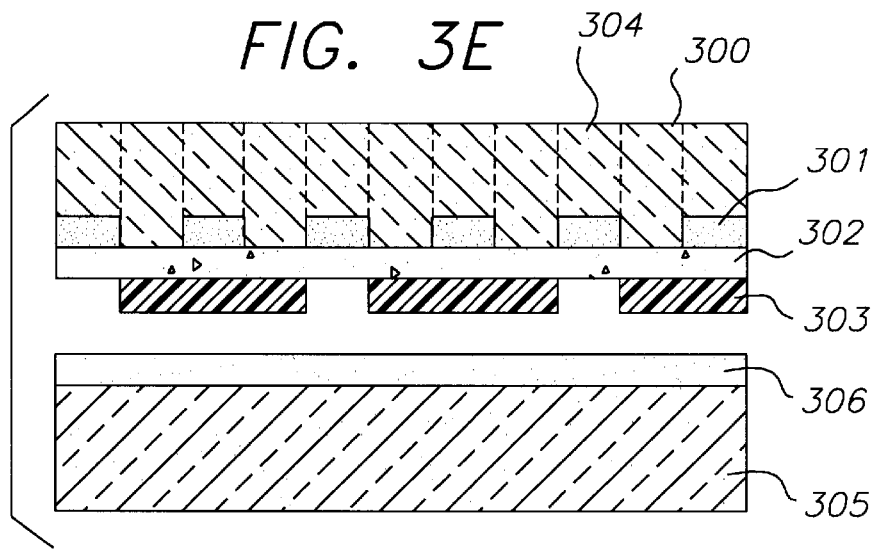
Figure 3F:
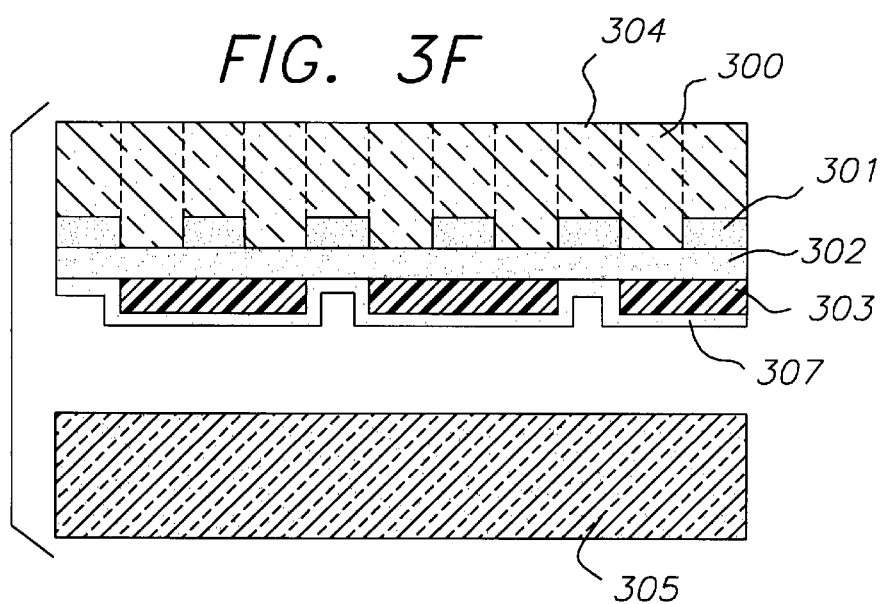

In FIG. 3e, the second substrate 305 and colorant layer 306 is shown positioned relative to the substrate 300 and the selected regions 304 in the substrate 305. In the process it is desired to transfer substantially all of the colorant layer 306 onto the substrate 305 and the selected regions 304. As shown in FIG. 3f, the transferred colorant material is now labeled number 307. In order to provide this transfer, heat is applied to the substrate 305. Typically, the substrate 305 is composed of metals, such as steel or aluminum or of a temperature-resistant plastic such as a polyimide film. Heating is often done by exposing the non-coated side of the substrate 305 to electromagnetic radiation of wavelengths which are absorbed by the substrate 305 or by the colorant layer 306 and are converted into heat by radiationless decay processes. The electromagnetic radiation may be applied over a large area simultaneously as from an extended lamp source, or it may be applied as a scanned beam as with a laser. It is appreciated that imagewise light exposure may be used to heat and transfer only a portion of the colorant layer 306. Another method used to heat substrate 305 in order to transfer the colorant material is to pass an electric current through the substrate 305, particularly when the substrate 305 used is composed entirely or partially of metal. In still another method, the substrate 305 may be heated by direct contact with an object such as a metal block, a high temperature roller, or other such devices which can be heated or pre-heated to the required temperature and which can transfer heat to the substrate 305 by direct thermal contact. Typical distances and pressures for the transfer of colorant are from about 0.1 mm to about 3 mm at pressures of less than or equal to about 0.1 Torr, up to a distance of about 50 mm at pressures of less than 0.001 Torr.

Figure 3G:
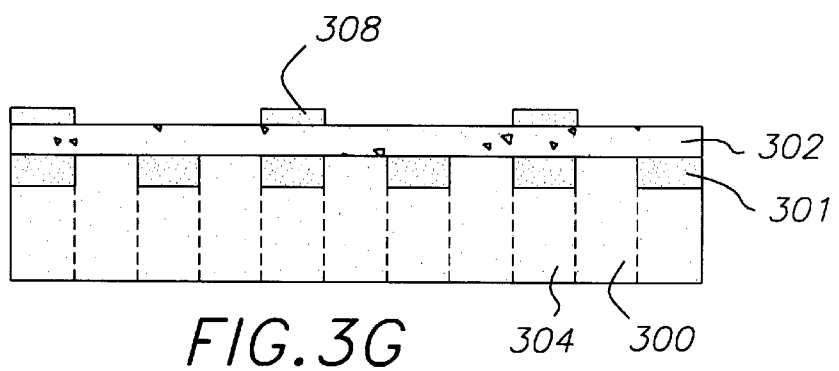

FIG. 3g shows the color filter array after a lift-off process. The liftoff process is needed to remove unwanted portions of the photoresist layer 303 and the portions of the colorant material 307 on the unwanted portions of the photoresist layer 303, leaving behind colorant material 308 over the selected regions.

In order to make a color filter array with a plurality of colors, the above steps need to be repeated for each new colorant layer that is deposited over pixels.

In an alternative method, after a photoresist layer is coated on a transparent substrate and subsequently patterned, the substrate is etched using the patterned photoresist as a mask.

In cases where there is an adhesion promoting layer on the substrate, it may be advantageous to etch only the adhesion promoting layer. A colorant material is then deposited over the patterned photoresist layer, and in the openings in the photoresist and the recesses in the adhesion promoting layer and in the substrate, if an etch step were used. A lift-off process is then used to remove the patterned photoresist layer and overlying colorant material.

Figure 4A:
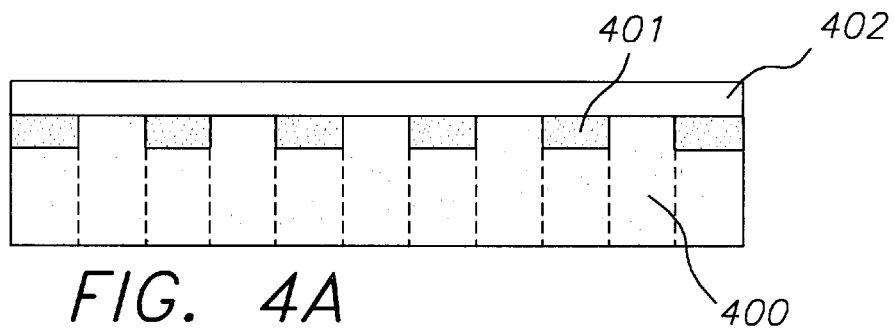
FIGS. 4a–f show various steps in a method similar to that shown in FIGS. 3a–g for making color filter arrays in accordance with the present invention.

Turning to FIG. 4a where a transparent substrate 400 is shown, in which are indicated regions 401 which are to receive colorant material and an adhesion promoting layer 402 which can be subsequently etched. As is well understood to those skilled in the art, the term substrate may include a composite of different layers.

Figure 4B:
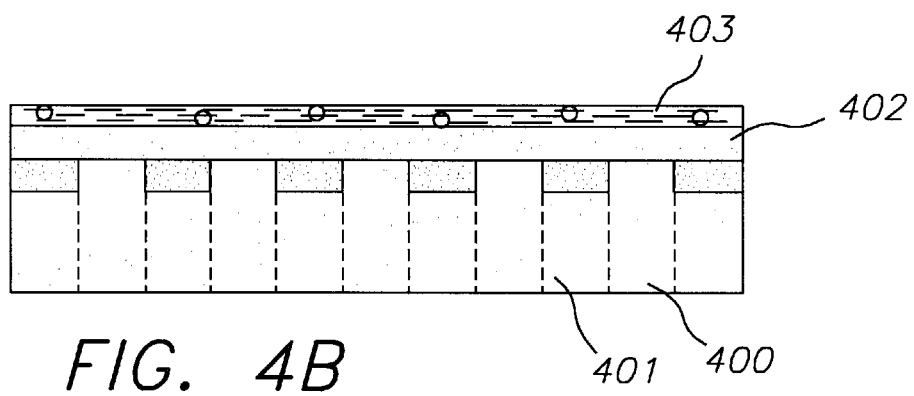

As shown in FIG. 4b, a layer of photoresist 403 is formed above the adhesion promoting layer 402.

Figure 4C:
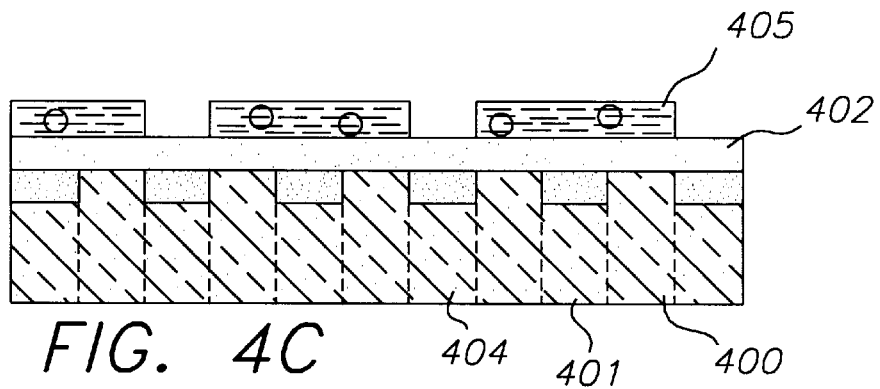

As shown in FIG. 4c, the photoresist is exposed and developed to form openings over selected regions 404, leaving patterned photoresist layer 405 over the rest of the adhesion-promoting layer 402.

Figure 4D:
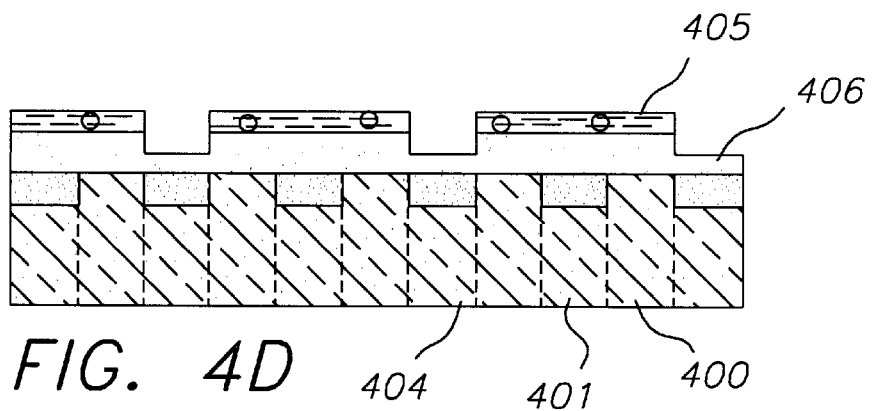

As shown in FIG. 4d, the openings in the patterned photoresist layer 405 are used as a mask for an etch of the underlying layer, to produce a pattern of recesses in the underlying layer, now numbered 406.

Figure 4E:
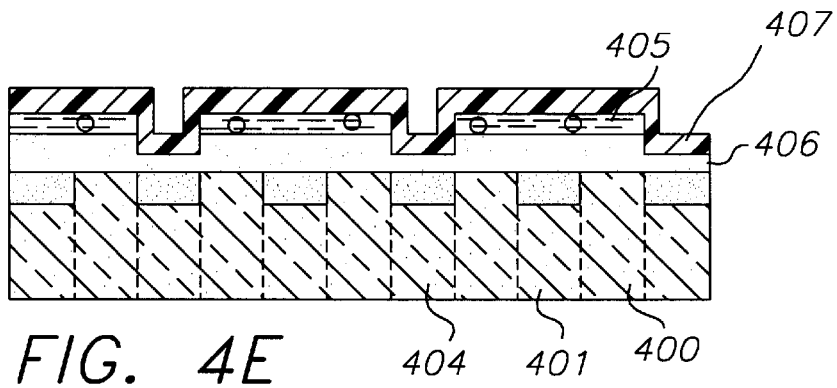

As shown in FIG. 4e, a colorant material is deposited on the patterned photoresist layer 405 and the recesses in underlying layer 406 to give colorant material 407.

Figure 4F:
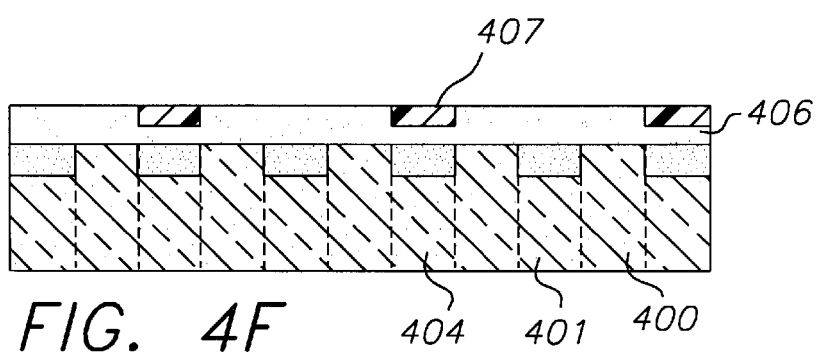

As shown in FIG. 4f, the portion of the colorant material 407 which is not above the selected regions 404 and the patterned photoresist layer 405 is removed by a lift-off process, to leave the patterned photoresist layer 406 and the colorant material 407 above the selected regions 404.

In order to make a color filter array with a plurality of colors, the steps 4b–4f need to be repeated for each new colorant layer that is deposited over subsequently selected pixels.

Figure 5A:
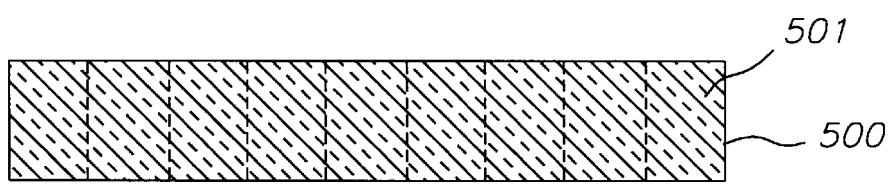
FIGS. 5a–i show various steps in a method similar to that shown in FIGS. 4a–f for making color filter arrays in accordance with the present invention.

Turning to FIG. 5a, a substrate 500 is shown, in which are indicated regions 501 which may receive colorant material. The substrate 500 may be a composite of different layers.

Figure 5B:
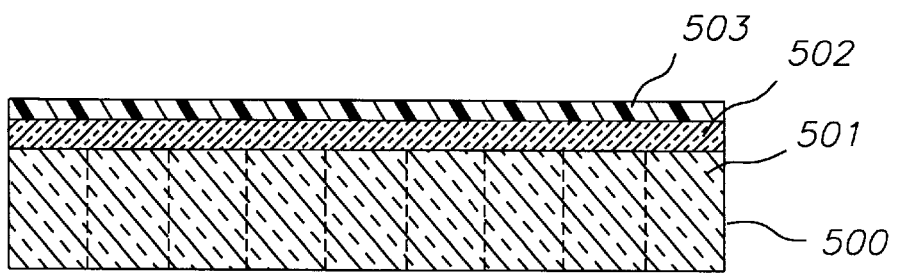

As shown in FIG. 5b, an adhesion promoting layer 502 which can be subsequently etched is formed on the substrate 500 and the selected regions 501, and a layer of photoresist 503 is formed above it.

Figure 5C:
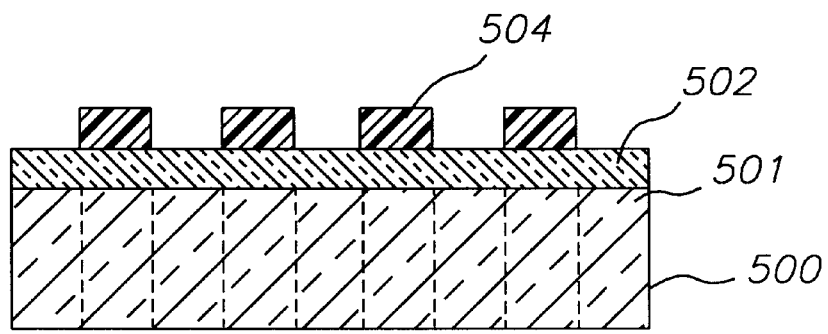

As is shown in FIG. 5c, the photoresist layer 503 is exposed and developed to form openings over selected regions 501, leaving patterned photoresist layer 504 over the rest of the adhesion promoting layer 502.

Figure 5D:
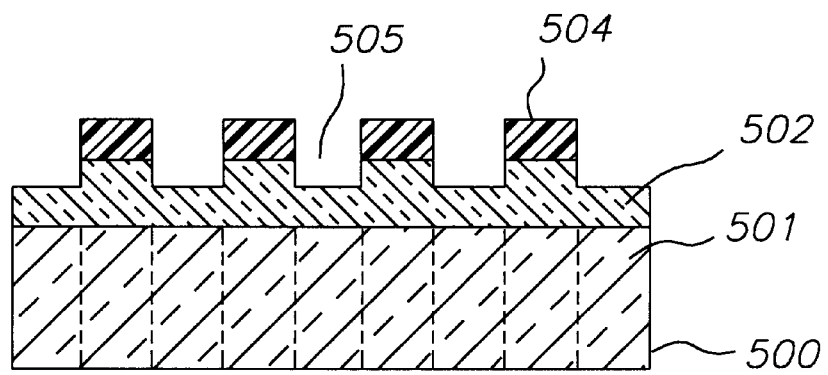

As shown in FIG. 5d, the openings in the patterned photoresist layer 504 are used as a mask for an etch of the underlying layer, to produce a pattern of recesses 505 in the underlying adhesion-promoting layer 502.

Figure 5E:
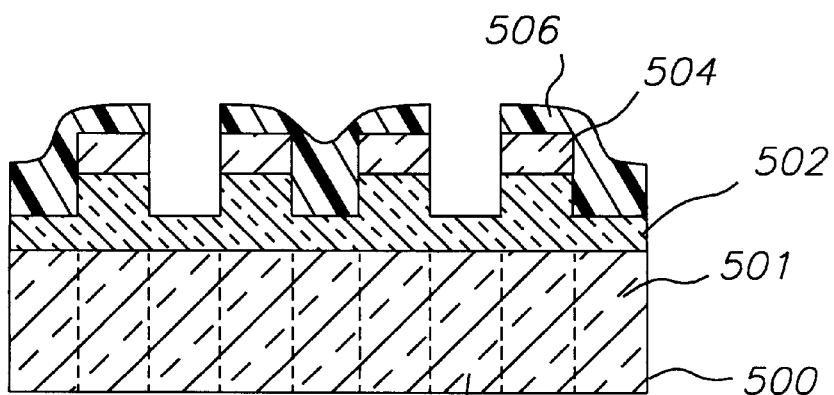

As shown in FIG. 5e, a second photoresist layer 506 is formed on the patterned photoresist layer 504 and the recesses in the adhesion-promoting layer 502 and the second photoresist layer 506 is exposed and developed to form openings over second selected regions 507.

Figure 5F:
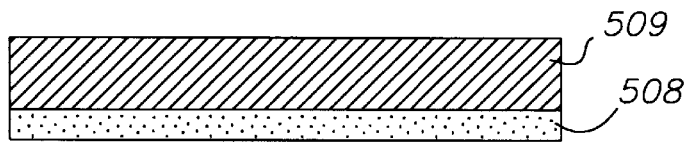

As shown in FIG. 5f, a colorant layer 508 is formed on a second substrate 509.

Figure 5G:
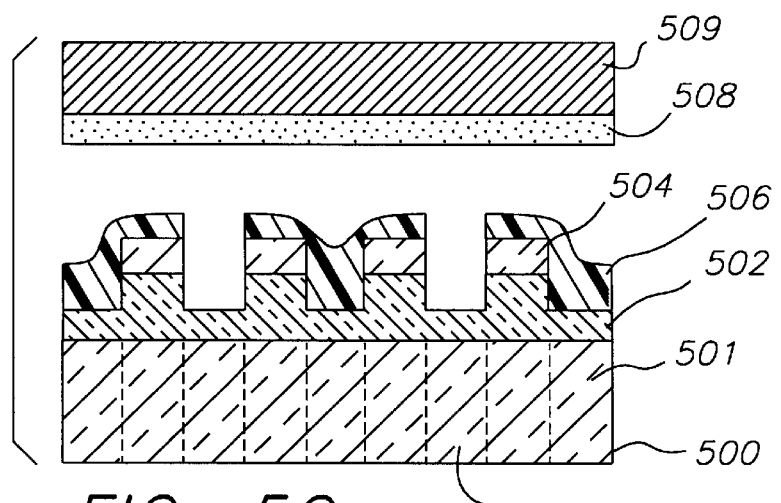

As shown in FIG. 5g, the second substrate 509 and colorant layer 508 are positioned relative to the substrate 500 and the second selected regions 507, such that the colorant material can be transferred onto the substrate 509 and the second selected regions 507.

Figure 5H:
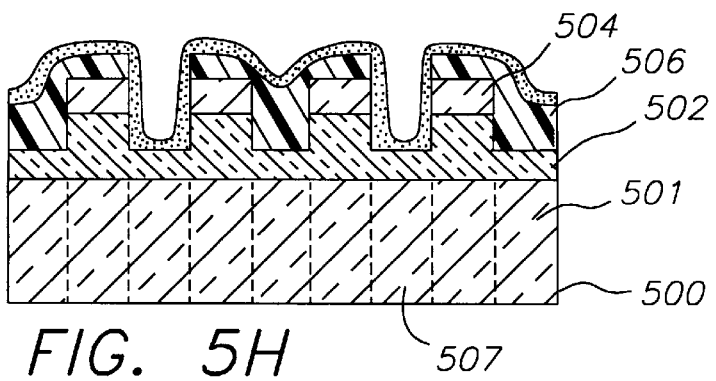

As shown in FIG. 5h, the colorant material, now 510, has been transferred onto the patterned second photoresist layer 506 and the recesses in the adhesion-promoting layer 502.

Figure 5I:
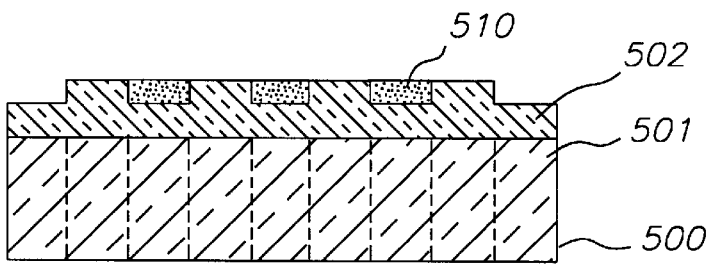

As shown in FIG. 5i, the patterned photoresist layer 504, the patterned second photoresist layer 506, and the overlying colorant material have been removed by a lift-off process, to leave colorant material 510 in the recesses 505 in adhesion promoting layer 502 and over the second selected regions 507.

In order to make a color filter array with a plurality of colors, the steps 5e–5i need to be repeated for each new colorant layer that is deposited over subsequently selected regions.

Colorants which are useful in the processes shown in FIGS. 3a–g, 4a–f, and 5a–i, include the following: phthalocyanines, such as Pigment Blue 15, nickel phthalocyanine, chloroaluminum phthalocyanine, hydroxy aluminum phthalocyanine, vanadyl phthalocyanine, titanyl phthalocyanine, and titanyl tetrafluorophthalocyanine; isoindolinones, such as Pigment Yellow 110 and Pigment Yellow 173; isoindolines, such as Pigment Yellow 139 and Pigment Yellow 185; benzimidazolones, such as Pigment Yellow 151, Pigment Yellow 154, Pigment Yellow 175, Pigment Yellow 194, Pigment Orange 36, Pigment Orange 62, Pigment Red 175, and Pigment Red 208; quinophthalones, such as Pigment Yellow 138; quinacridones, such as Pigment Red 122, Pigment Red 202, and Pigment Violet 19; perylenes, such as Pigment Red 123, Pigment Red 149, Pigment Red 179, Pigment Red 224, and Pigment Violet 29; dioxazines, such as Pigment Violet 23; thioindigos, such as Pigment Red 88, and Pigment Violet 38; epindolidiones, such as 2,8-difluoroepindolidione; anthanthrones, such as Pigment Red 168; isoviolanthrones, such as isoviolanthrone; indanthrones, such as Pigment Blue 60; imidazobenzimidazolones, such as Pigment Yellow 192; pyrazoloquinazolones, such as Pigment Orange 67; diketopyrrolopyrroles, such as Pigment Red 254, Irgazin DPP RubinTR, Cromophtal DPP OrangeTR; Chromophtal DPP Flame Red FP (all of Ciba-Geigy); and bisaminoanthrones, such as Pigment Red 177.

EXAMPLES

In accordance with the above-stated invention, the following has been performed.

Example 1

Commercially obtained copper phthalocyanine was heated by passing electrical current through the tantalum boat which contained it, while maintaining a reduced pressure of approximately 6×10-5 Torr in a vacuum bell jar. About 0.2 microns of phthalocyanine were deposited onto a section of stainless steel foil, having a thickness of about 25 microns. The coated foil was then mounted about 3 mm distant from a silicon wafer which had been spin-coated with about 1 micron of poly(methyl glutarimide), "PMGI" from Microelectronics Chemical Corp., and then coated with about 1.3 microns of photoresist AZ5214IR (Hoechst Celanese Corp.) which was subsequently patterned and developed, and the non-coated side of the foil was positioned about 25 mm from an array of heat lamps (General Electric, Part no. QH500T3/CL) spaced about 30 mm apart. The assembly was subjected to a vacuum of about 6×10E-5 Torr and the heat lamps were powered for 60 seconds to transfer the phthalocyanine to the silicon wafer. The water was removed from the vacuum chamber and subjected to ultrasound in a tray of acetone for 90 seconds, using a Branson Model 3200 ultrasonic bath. The photoresist was completely removed by this treatment, leaving intact the copper phthalocyanine features in the desired pattern.

Example 2

Commercially obtained copper phthalocyanine was heated by passing electrical current through the tantalum boat which contained it, while maintaining a reduced pressure of about 6×10E-5 Torr in a vacuum bell jar. About 0.2 microns of phthalocyanine were deposited onto a section of stainless steel foil, having a thickness of about 25 microns. The coated foil was then mounted about 3 mm distant from a glass substrate, and the foil was clamped between two electrodes. The assembly was subjected to a vacuum of about 0.1 Torr, and electric current was passed through the foil (at 30 volts) for about 10 sec., causing the ends of the foil to reach a temperature of about 260 degrees C and the phthalocyanine to transfer to the glass substrate.

The invention has been described in detail with particular reference to certain preferred embodiments thereof, but it will be understood that variations and modifications can be effected within the spirit and scope of the invention.

| Parts List | |
|---|---|
| 100 | heated source |
| 102 | substrate |
| 103 | paths |
| 104 | mask |
| 105 | mask |
| 200 | substrate |
| 201 | substrate |
| 202 | heat sources |
| 203 | radiant heat |
| 204 | aperture |
| 205 | arrows |
| 300 | substrate |
| 301 | regions |
| 302 | adhesion-promoting layer |
| 303 | photoresist layer |
| 304 | selected regions |
| 305 | substrate |
| 306 | colorant layer |
| 307 | colorant material |
| 308 | colorant material |
| 400 | substrate |
| 401 | regions |
| 402 | adhesion-promoting layer |
| 403 | photoresist layer |
| 404 | selected regions |
| 405 | patterned photoresist layer |
| 406 | underlying layer |
| 407 | colorant material |
| 500 | substrate |
| 501 | regions |
| 502 | adhesion-promoting layer |
| 503 | photoresist layer |
| 504 | patterned photoresist layer |
| 505 | recesses |
| 506 | photoresist layer |
| 507 | second selected regions |
| 508 | colorant layer |
| 509 | substrate |
| 510 | colorant material |

What is claimed is:

1. A method of making a color filter array on a first substrate, comprising the steps of:
   a) depositing and patterning a photoresist layer on the first substrate to form openings over selected regions of the first substrate;
   b) providing a transferable colorant layer having a heat transferable colorant material on a second substrate and positioning the second substrate such that the heat transferable colorant layer is in transferable relationship but spaced a distance from the first substrate;
   c) heating the second substrate sufficiently to cause substantially all of the heat transferable colorant material to transfer across the spaced distance to the patterned photoresist layer on the first substrate; and d) removing the patterned photoresist layer leaving behind the heat transferable colorant material in the position of the openings over the selected regions of the first substrate.

2. The method of claim 1, wherein the removing step includes lifting off the patterned photoresist layer, leaving behind the heat transferable colorant material in the position of the openings over the selected regions of the first substrate.

3. The method of claim 1 further including repeating steps a)–d) for different colorant materials.

4. The method of claim 1 wherein the transferring steps are performed at pressures ≦0.1 Torr.

5. The method of claim 1 wherein the transferring steps are performed at a distance of ≦50 mm.

6. The method of claim 1 wherein the transferring steps are performed at pressures ≦0.1 Torr and at a distance of about 0.1 mm to about 3 mm.

7. The method of claim 1 wherein the transferring steps are performed at pressures ≦0.001 Torr and at a distance of ≦50 mm.

8. The method of claim 1 wherein the colorant material is selected from the group consisting of: phthalocyanines; isoindolinones, benzimidazolones; quinophthalones; quinacridones; perylenes; dioxazines; epindolidiones; isoviolanthrones; indanthrones; imidazobenzimidazolones; pyrazoloquinazolones; diketopyrrolopyrroles; and bisaminoanthrones.

9. A method of making a color filter array on a first substrate, comprising the steps of:

a) depositing and patterning a photoresist layer on the first substrate to form openings over selected regions of the first substrate;

b) etching through the opening in the patterned photoresist layer, using it as a mask, to form a pattern of recesses in the first substrate;

c) providing a transferable colorant layer having a heat transferable colorant material on a second substrate and positioning the second substrate such that the heat transferable colorant layer is in transferable relationship with but spaced a distance from the first substrate;

d) heating the second substrate sufficiently to cause substantially all of the heat transferable colorant material to transfer across the spaced distance to the patterned photoresist layer on the first substrate; and e) removing the patterned photoresist layer, leaving behind the heat transferable colorant material in the position of the openings over the selected regions of the first substrate.

10. The method of claim 9 including providing an adhesion promoting layer on the first substrate, upon which is deposited the photoresist layer, and which is etched in the etching step.

11. The method of claim 9, wherein the removing step includes lifting off the patterned photoresist layer, leaving behind the heat transferable colorant material in the position of the openings over the selected regions of the first substrate.

12. The method of claim 9 further including repeating steps a)–e) for different colorant materials.

13. The method of claim 9 wherein the transferring steps are performed at pressures ≦0.1 Torr.

14. The method of claim 9 wherein the transferring steps are performed at a distance of ≦50 mm.

15. The method of claim 9 wherein the transferring steps are performed at pressures ≦0.1 Torr and at a distance of about 0.1 mm to about 3 mm.

16. The method of claim 9 wherein the transferring steps are performed at pressures ≦0.001 Torr and at a distance of ≦50 mm.

17. The method of claim 9 wherein the colorant material is selected from the group consisting of: phthalocyanines; isoindolinones, benzimidazolones; quinophthalones; quinacridones; perylenes; dioxazines; epindolidiones; isoviolanthrones; indanthrones; imidazobenzimidazolones; pyrazoloquinazolones; diketopyrrolopyrroles; and bisaminoanthrones.

18. A method of making a color filter array on a first substrate having an array of pixels, comprising the steps of:

a) depositing and patterning a photoresist layer on the first substrate to form openings over selected regions in the substrate;

b) etching through the openings in the patterned photoresist layer using it as a mask to form a pattern of recesses in the first substrate;

c) depositing and patterning a second photoresist layer on the patterned photoresist layer to form openings over second selected regions of the first substrate;

d) providing a heat transferable colorant layer having a heat transferable colorant material on a second substrate and positioning the second substrate such that the heat transferable colorant layer is in transferable relationship with but spaced a distance from the first substrate;

e) heating the second substrate sufficiently to cause substantially all of the heat transferable colorant material to transfer across the spaced distance to the second patterned photoresist layer on the first substrate; and f) removing both the patterned photoresist layers, leaving behind the heat transferable colorant material in the position of the openings over the second selected regions of the first substrate.

19. The method of claim 18 including providing an adhesion promoting layer on the first substrate before depositing and patterning a photoresist layer.

20. The method of claim 18, wherein the removing step includes lifting off the patterned photoresist layers, leaving behind the heat transferable colorant material in the position of the openings over the second selected regions of the first substrate.

21. The method of claim 18 further including repeating steps a)–f) for different colorants.

22. The method of claim 18 wherein the transferring steps are performed at pressures ≦0.1 Torr.

23. The method of claim 18 wherein the transferring steps are performed at a distance of ≦50 mm.

24. The method of claim 18 wherein the transferring steps are performed at pressures <0.1 Torr and at a distance of about 0.1 mm to about 3 mm.

25. The method of claim 18 wherein the transferring steps are performed at pressures ≦0.001 Torr and at a distance of ≦50 mm.

26. The method of claim 18 wherein the colorant material is selected from the group consisting of: phthalocyanines; isoindolinones, benzimidazolones; quinophthalones; quinacridones; perylenes; dioxazines; epindolidiones; isoviolanthrones; indanthrones; imidazobenzimidazolones; pyrazoloquinazolones; diketopyrrolopyrroles; and bisaminoanthrones.

* * * * *